METHODS OF MAKING RECTIFYING AND OHMIC JUNCTIONS

Original Filed Nov. 28, 1958

INVENTOR
LEON S. GREENBERG
BY H. Vincent Harsha
ATTORNEY

United States Patent Office 3,104,992

Patented Sept. 24, 1963

3,104,992

METHODS OF MAKING RECTIFYING AND OHMIC JUNCTIONS

Leon S. Greenberg, Natick, Mass., assignor to Raytheon Company, a corporation of Delaware Continuation of application Ser. No. 777,046, Nov. 28, 1958. This application Aug. 3, 1960, Ser. No. 47,326
11 Claims. (Cl. 148—1.5)

This is a continuation of our copending application, Serial No. 777,046, filed November 28, 1958.

The present invention relates to semiconductor devices and more particularly pertains to a method for forming rectifying junctions or ohmic connections on a semiconductor body.

A typical semiconductor device to which this invention is applicable is a transistor which comprises a semiconductor wafer having at least two rectifying junctions and at least one ohmic connection. As is well known, a semiconductor material containing donor impurities in an amount resulting in an excess of free electrons is considered to be an N type material while a P type material is one containing acceptor impurities in an amount resulting in a deficiency of free electrons, viz., an excess of holes. When a continuous solid crystal of semiconductor material has an N type region contiguous to a P type region, it is termed a transistor couple or P-N junction and is characterized by the ability to rectify electric current. An ohmic connection, on the other hand, is formed by a continuous solid crystal of N or P type semiconductor material having fused thereto material of the same conductivity type so that the ohmic connection does not rectify electric current. In the fabrication of a transistor both rectifying junctions and ohmic connections are required and, therefore, this invention is particularly advantageous as the method disclosed herein may be utilized to produce rectifying and non-rectifying connections.

Rectifying junctions have been produced in semiconductor materials predominantly by either of two well-known processes, viz., the crystal-pulling method in which the junction is grown by withdrawing a seed crystal from a doped melt of semiconductor material, and the diffusion (or fusion) method in which a region of one conductivity type is converted to the opposite conductivity type.

The use of diffusion techniques in the fabrication of semiconductor devices has raised the maximum operating frequency orders of magnitude above that attainable in grown devices. This advantage comes from two sources: (1) the diffusion process results in an impurity distribution in the base region which effectively increases the minority carrier mobility, and (2) the much greater control attainable with diffusion techniques allows the use of much thinner base regions. The diffusion techniques have stimulated the fabrication of transistors designed to operate at several hundred megacycles and has made available semiconductor devices for use in switching circuits in which the total switching time, that is, rise and fall and storage time, is only a few millimicroseconds.

In order to achieve high frequency operation with semiconductor devices it has been necessary to make the junctions of extremely small area and to employ connecting lead-in wires which are smaller in diameter than the thickness of a human hair. It is known that factors such as the extent, shape, and position of the junction and the depth of penetration of the conductivity type determining impurity have a marked effect on the operating characteristics of a semiconductor device. In order to fabricate devices having reproducible characteristics, it is necessary to control closely the amount of impurity and the area of the semiconductor to which the impurity is applied. For example, an acceptor impurity such as indium may be applied to an area of a semiconductor such as N type germanium and in the diffusion process the depth of penetration of the indium into the N type germanium depends upon the duration and temperature of the heating cycle, the amount of indium, and the size of the area attacked by the indium. Thus, if the indium spreads out over a wide area, the depth of penetration is less than if the indium is confined to a small area, whereas if the molten indium forms a sphere due to surface tension, the indium will attack a smaller area and the depth of penetration may be deeper than is desired. Considerable difficulty has been encountered in developing methods for controlling the extent and shape of the junction and the depth of penetration of the impurity. To form a junction with the desired area, a technique has been employed in which the impurity materials are vaporized and the vapor is permitted to pass through a slit and be deposited on the surface of the wafer. The thickness of the deposited film is in the order of 10 millionths of an inch and the film is caused to be alloyed with the semiconductor to approximately that same depth. After the junction has been formed, a lead-in wire must be attached, and it has been necessary to utilize micromanipulators to position the wire over the junction area. The difficulties attendant in attempting to attach a lead-in wire to the junction are due to the minuteness of the wire which in a typical case is .4 mil (.004") in diameter and the area of the junction which is 1 mil (.001") wide. Attempting to center the end of the wire over the junction has proved to be extremely difficult and it is common practice to place the wire transversely across the junction and bond an intermediate portion of the wire to the junction. The processes now employed in fabricating high frequency semiconductor devices require precise, time-consuming, and expensive operations which have necessarily resulted in low volume production and consequent high cost per item.

This invention is directed to a method for making alloy junctions or ohmic connections on a semiconductor body which avoids the difficulties related above. Briefly, the method contemplates embedding in a matrix a wire whose end configuration and size correspond to the size and configuration of the junction to be formed and then exposing the wire's end by sawing through the matrix or grinding one of its faces. After exposing the wire's end, the desired surface finish is obtained by lapping or buffing the exposed end. The exposed end of the wire is then coated with a film of an active impurity. This may be accomplished by electrodeposition, electroplating, or by depositing a vaporized film over the entire surface of the matrix. The matrix is then dissolved, freeing the wire. The coated end of the wire is positioned upon a semiconductor body and the ensemble is heated to cause the film to alloy with the semiconductor. Because the impurity film is very thin, it does not spread but rather alloys only with the semiconductor material under the wire's end. When the alloy solidifies, it forms a rectifying junction and simultaneously bonds the wire to the semiconductor body.

The nature of the present invention and several exemplary modes of practising the novel method are more fully set forth in the following exposition in which reference is made to the accompanying drawings wherein.

Semiconductor devices presently available in the commercial market are fabricated from either germanium or silicon. The principles of the present invention, however, are not limited to the use of germanium or silicon, but are intended to include any materials of the class known as semiconductors, which may have their electrical characteristics altered by alloying therewith a conductivity type determining impurity element. In addition to germanium and silicon, other semiconductors include silicon carbide, germanium-silicon alloys and the so-called intermetallic compounds formed from metallic elements of groups III and V of the periodic table according to Mendelyeev. For example, these may include indium antimonide, indium phosphide, indium arsenide, aluminum antimonide, gallium antimonide, lead sulfide, lead telluride, cadmium sulfide, cadmium selenide, etc. Because the above-mentioned intermetallic compounds are composed of materials which separately are considered to be impurity elements when introduced into materials selected from group IV of the periodic table, the intermetallic compounds formed therefrom may be N or P type, depending upon the degree of unbalance in the atomic proportions of the materials constituting the body.

The terms "impurity" or "active impurity" as used herein denote any of the chemical elements or compounds which affect electrical characteristics of semiconductor materials by causing those semiconductor materials to have either an excess of free electrons or an excess of holes, as distinguished from other substances which have no appreciable effect in determining the conductivity type of semiconductor materials. Generally, impurities are classified as either donors, which include antimony, arsenic, bismuth and phosphorus, or acceptors, which include indium, gallium, thallium, boron and aluminum.

The invention will be described with reference to the fabrication of a germanium transistor, however, silicon or any of the other semiconductor materials may be utilized to fabricate semiconductor devices in accordance with the method of the present invention.

Figure 1:
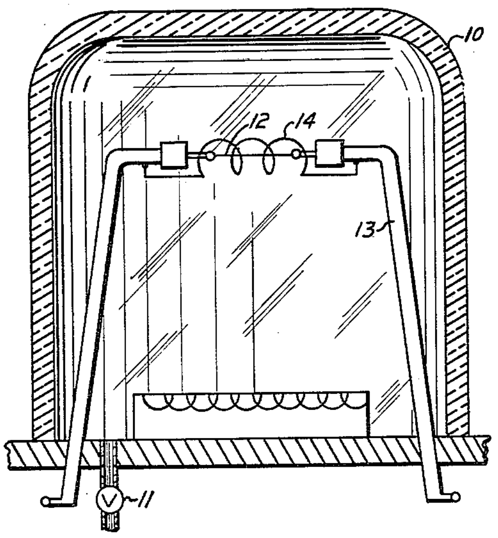
FIG. 1 illustrates a vacuum chamber and associated apparatus for coating the ends of a wire with a vaporized film of an impurity substance.
Figure 2:
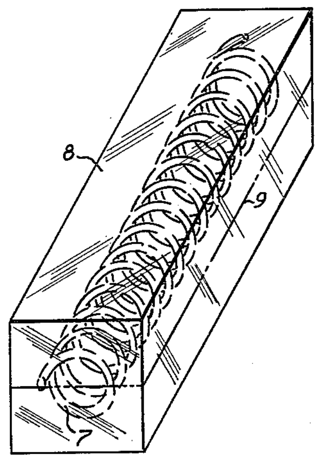
FIG. 2 depicts a helical wire embedded in a matrix.
Figure 4:
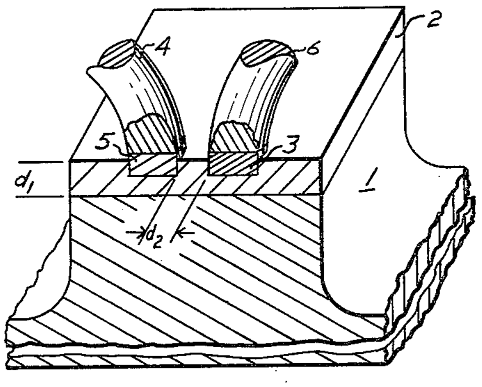
FIG. 4 shows a section of a transistor constructed in accordance with the invention.

FIG. 4 depicts a mesa type, PNP, diffused base, alloyed emitter, germanium transistor. The initial wafer 1 is a P type germanium and an N type base layer 2 is formed by the diffusion of antimony into one face of the wafer to a depth $d_1$ of about .04 mil. A rectifying junction 3 is formed by causing indium to alloy with the N type base so that the alloy is of the P conductivity type. Since the base region has a thickness of four hundred thousandths of an inch (.04 mil), great care must be exercised to prevent the indium from perforating the base and entering the P type germanium. A lead-wire 4 is attached to the base region by an ohmic connection 5, and the ohmic connection is separated from the rectifying junction by a distance $d_2$ of five ten-thousandths of an inch (.5 mil). A second lead-in wire 6 is attached to the rectifying junction. The method of making the rectifying junction and the ohmic connection forms the subject matter of this invention. A wire whose end configuration and size correspond to the size and configuration of the junction to be formed is wrapped around a mandrel to form a helix 7 and the helix is embedded as illustrated in FIG. 2, in a matrix, which is preferably a plastic substance such as Lucite. The matrix or embedding block 8 is then sawed so that the helix is divided into two equal parts along its longitudinal axis, as indicated by the parting plane 9 in FIG. 2. By thus dividing the helix into two parts, a large number of wire ends are exposed. In order to smooth the exposed ends of the helix so that they present a planar surface, the sawed face of the embedding block may be lapped or buffed to obtain the desired surface finish on ends of the wire. The two halves of the matrix are then placed in a bell jar 10, as indicated in FIG. 1 and the bell jar is evacuated by means of a pump connected to the valve 11. After an adequate vacuum has been established in the bell jar a ribbon 12 of an acceptor impurity, indium, for example, is suspended from a frame 13 in the bell jar, and is vaporized by means of a heating coil 14 so that a thin film of the indium vapor is evenly deposited over the upturned surface of the matrix. By precisely controlling the amount of indium introduced into the chamber, a film thickness can be obtained which is extremely accurate, the nominal thickness of the indium film being .008 mil. After being coated with indium, the matrix block is removed and the matrix is dissolved in a suitable solvent to free the embedded wires. Because the indium film is less than one one-hundred-thousandth of an inch thick, it has been found that when the matrix is dissolved only those portions of the film which have been deposited on the ends of the wires remain after the matrix has passed into solution. The wires are then removed from the solvent and may be treated to remove any traces of the solvent. The indium-coated end of the wire is then disposed upon the base layer of the germanium wafer and is held in the desired position by a suitable fixture. The assemblage is placed in an oven having a hydrogen atmosphere and heated to a temperature above 500 degrees centigrade to cause the indium to become molten and alloy with the N type germanium. Since the film of indium is very thin and is sandwiched between the end of the wire and the germanium base, the indium attacks only the area immediately below the end of the wire so that the resulting junction conforms closely to the cross-sectional area of the wire. In lieu of a wire having a circular cross-section, there may be substituted a metallic ribbon having a rectangular or other cross-sectional configuration. The area and shape of the desired junction will determine the configuration of the wire to be used.

An ohmic connection may be made to the N type germanium base layer in a similar manner by coating the end of a wire with tin or gold instead of indium. If desired, a donor impurity such as antimony may be coated over the tin or gold so as not to dilute the donor impurity in the vicinity of the ohmic connection when the tin or gold is alloyed to the germanium base layer.

Figure 3:
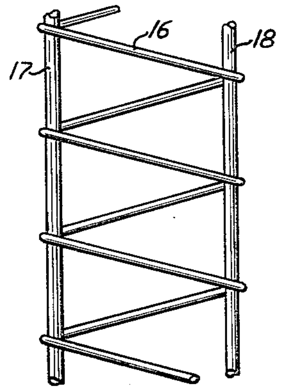
FIG. 3 illustrates a wire wound upon two spaced supporting rods.

As an alternative to coating the ends of the wire by means of vapor deposition, as described above, it is feasible to electroplate the ends of the wire. Where the coating is to be electroplated, a wire 16 is wound between two electrically conductive supports 17, 18, as shown in FIG. 3. The grid winding machines employed to fabricate grids used in electronic vacuum tubes are admirably suited for this purpose. The assembly is then embedded in a matrix, in a manner similar to that shown in FIG. 2 and the matrix is subsequently sawed in half along a plane which is intermediate the supports 17 and 18 to expose a multitude of wire ends. The sawed faces of the matrix halves may then be buffed or lapped to smooth the wire ends. Subsequently the matrix halves are immersed in an electroplating bath and a potential applied to the wires through the conductive post 17 or 18 until the desired thickness of coating material (indium, gold, tin, etc.) is plated onto the exposed wire ends. After the electroplating operation, the matrix is dissolved and the remaining steps are carried out in the manner previously described.

The material of which the lead-in wire is constituted has not thus far been specified because the choice of materials is extremely broad. Of course, necessary attributes of the wire material are such that the coating will adhere to the end of the wire and that the wire material will not melt before or at the temperature at which the coating alloys with the semiconductor. Molybdenum wire, palladium wire, Kovar wire, and nickel wire are suitable where indium, tin, or gold are the coating substances. It is desirable to employ a wire whose thermal expansion properties match those of the semiconductor. An important advantage of the invention is that the choice of materials for the lead-in wire is very great.

This invention is not limited to particular details or materials which are employed only as examples for carrying out the invention. It should be clear to the reader that the embedded wire shown in FIG. 2 need not be a helix but may be bent into any meandering configuration so long as a plurality of wire ends are exposed when the matrix is split. It should also be clear that the matrix may be split into more than two parts in order to expose more wire ends. It is accordingly desired that the appended claims be given an interpretation commensurate with the contribution of the invention to the art.

What is claimed is:

1. The method of bonding a lead-in wire to a semiconductor body comprising the steps of coating the end of a wire with a film of a conductivity-type imparting substance to be alloyed with the semiconductor body, superposing the coated end of the wire on the semiconductor body, and heating the assemblage to cause the coating to fuse with the underlying contiguous portion of the semiconductor body.

2. The method of forming a rectifying junction on a semiconductor body comprising the steps of coating the end of a wire with a film of a conductivity-type imparting impurity, superposing the coated end of the wire on the semiconductor body, and heating the assemblage to cause the impurity coating to alloy with the underlying contiguous portion of the semiconductor body.

3. The method of making a junction on a semiconductor body comprising the steps of embedding in a matrix a wire having an end configuration conforming to the configuration of the junction to be formed in a matrix, coating the exposed end of the wire with a film of a conductivity-type imparting substance to be alloyed with the semiconductor body, removing the matrix to free the wire, superposing the coated end of the wire on the semiconductor body, and heating the assemblage to cause the coating to fuse with the underlying contiguous portion of the semiconductor body.

4. The method of forming a rectifying junction on a semiconductor body comprising the steps of embedding in a matrix a wire having an end configuration conforming to the configuration of the junction to be formed, exposing an end of the embedded wire, coating the exposed end of the wire with a film of a conductivity-type imparting impurity to be alloyed with the underlying contiguous portion of the semiconductor body, removing the matrix to free the wire, superposing the coated end of the wire on the semiconductor body, and heating the assemblage to cause the impurity coating to alloy with the underlying contiguous portion of the semiconductor body.

5. The method of forming a junction on a semiconductor body comprising the steps of embedding in a matrix a convoluted wire having a cross-sectional configuration congruent with the configuration of the junction to be formed, dividing the matrix into parts to cause the wire to be segmented and to expose a plurality of wire ends, deposited upon the exposed wire ends a film of a conductivity-type imparting impurity to be alloyed with the underlying contiguous portion of the semiconductor body, removing the matrix to free the segments of wire, superposing the coated end of the wire on the semiconductor body, and heating the assemblage to cause the impurity coating to alloy with the underlying contiguous portion of the semiconductor body.

6. The method of forming a junction on a semiconductor body comprising the steps of embedding in a matrix a convoluted wire having a cross-sectional configuration congruent with the configuration of the junction to be formed, dividing the matrix into parts to cause the wire to be segmented and a plurality of wire ends to be exposed, placing said matrix parts in a chamber, causing a film of a vaporized conductivity-type imparting impurity to be deposited upon the exposed wire ends, dissolving the matrix to free the segments of wire, superposing the coated end of a wire segment on the semiconductor body, and heating the assemblage to cause the impurity coating to alloy with the underlying contiguous portion of the semiconductor body.

7. The method of forming a junction on a semiconductor body comprising the steps of embedding in a matrix a convoluted wire having a cross-sectional configuration congruent with the configuration of the junction to be formed, dividing the matrix into parts to cause the wire to be segmented and a plurality of wire ends to be exposed, placing said matrix parts in an electroplating bath, applying a potential to the wire segments to cause a coat of a conductivity-type imparting impurity to be plated onto the exposed wire ends, removing the matrix to free the segments of wire, superposing the coated end of a wire segment on the semiconductor body, and heating the assemblage to cause the impurity coating to alloy with the underlying contiguous portion of the semiconductor body.

8. The method of forming a junction on a semiconductor body comprising the steps of winding upon electrically conductive supports a wire having a cross-sectional configuration congruent with the configuration of the junction to be formed, embedding said wire in a matrix, severing the matrix into parts to cause the wire to be segmented and a plurality of wire ends to be exposed, placing a matrix part in an electroplating bath, applying a potential to the wire segments through the associated support to cause a coat of a conductivity-type imparting impurity to be plated onto the exposed wire ends, removing the matrix to free the wire segments, superposing the coated end of a wire segment on the semiconductor body, and heating the assemblage to cause the impurity coating to alloy with the underlying contiguous portion of the semiconductor body.

9. The method of attaching a lead to a semiconductor body, said method comprising applying a coating of a conductivity-type imparting substance to be alloyed with said semiconductor body to a surface of said lead while maintaining other surface portions of said lead free of said coating material, superposing the coated surface of said lead on said semiconductor body, and heating the assemblage to cause the coating to fuse with said underlying contiguous portion of the semiconductor body and attach said lead to said body.

10. The method of attaching a lead wire to a semiconductor body, said method comprising the steps of vapor depositing a coating of a conductivity-type imparting substance upon an end of said wire while maintaining the rest of said wire free of said coating, superposing the coated end of said wire on said semiconductor body, and heating the assemblage to cause the coating to fuse with said underlying contiguous portion of the semiconductor body and thereby attach said lead wire to said body.

11. The method of attaching a lead wire to a semiconductor body, said method comprising applying a film of a conductivity-type imparting substance to be alloyed with said body to an end of said wire, said film having a thickness on the order of .008 mil, placing said end of said wire in contact with said semiconductor body, and heating the assemblage to cause the wire to become attached to the underlying contiguous portion of said semiconductor body.

References Cited in the file of this patent

UNITED STATES PATENTS

| | | |
|---|---|---|
| 2,820,135 | Yama Kawa | Jan. 14, 1958 |
| 2,886,475 | McKay | May 12, 1959 |
| 2,989,578 | Wagner et al. | June 20, 1961 |